US006329935B1

(12) United States Patent
Stephen

(10) Patent No.: US 6,329,935 B1
(45) Date of Patent: Dec. 11, 2001

(54) TEMPORALLY SEPARATING AND RE-ORGANIZING DATA USING TWO-STAGE INTERLEAVING AND DE-INTERLEAVING

(75) Inventor: Karen J. Stephen, Carlsbad, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/470,338

(22) Filed: Dec. 22, 1999

(51) Int. Cl.$^7$ ...................................................... H03M 7/00
(52) U.S. Cl. ................................... 341/81; 371/37; 371/38
(58) Field of Search .................................. 341/81, 59, 82, 341/94, 100, 101, 61, 58; 371/38, 40, 37.1, 43, 37

(56) References Cited

U.S. PATENT DOCUMENTS

| | | | | |
|---|---|---|---|---|
| 4,433,415 | * | 2/1984 | Kojima ..................................... | 371/37 |
| 4,459,696 | * | 7/1984 | Kojima ..................................... | 371/38 |
| 5,691,995 | * | 11/1997 | Ikeda et al. ............................ | 371/43 |
| 5,757,822 | * | 5/1998 | Fisher et al. ......................... | 371/37.1 |
| 6,204,781 | * | 3/2001 | Aziz et al. .............................. | 341/59 |

* cited by examiner

*Primary Examiner*—Brian Young
*Assistant Examiner*—John Nguyen
(74) *Attorney, Agent, or Firm*—Blakely, Sokoloff, Taylor & Zafman LLP

(57) ABSTRACT

The present invention is a method and apparatus for temporally separating an input data stream in a transmit circuit and for re-organizing a temporally separated input data stream in a receive circuit.

In the transmit circuit, a first interleaver interleaves the serial input data stream. A first converter is coupled to the first interleaver to convert the interleaved serial input data stream into groups of N-bit words where N is a positive integer. A second interleaver is coupled to the first converter to interleave the groups of N-bit words. A second converter is coupled to the second interleaver to convert the interleaved groups of N-bit words into a serial output data stream. The output data stream corresponds to the temporally separated input data stream.

In the receive circuit, a first converter converts the serial input data stream into groups of N-bit words where N is a positive integer. A first de-interleaver is coupled to the first converter to de-interleave the groups of N-bit words. A second converter is coupled to the first de-interleaver to convert the de-interleaved groups of N-bit words into interleaved serial data. A second de-interleaver is coupled to the second converter to de-interleave the interleaved serial data into an output data stream. The output data stream corresponds to the re-organized input data stream.

60 Claims, 9 Drawing Sheets

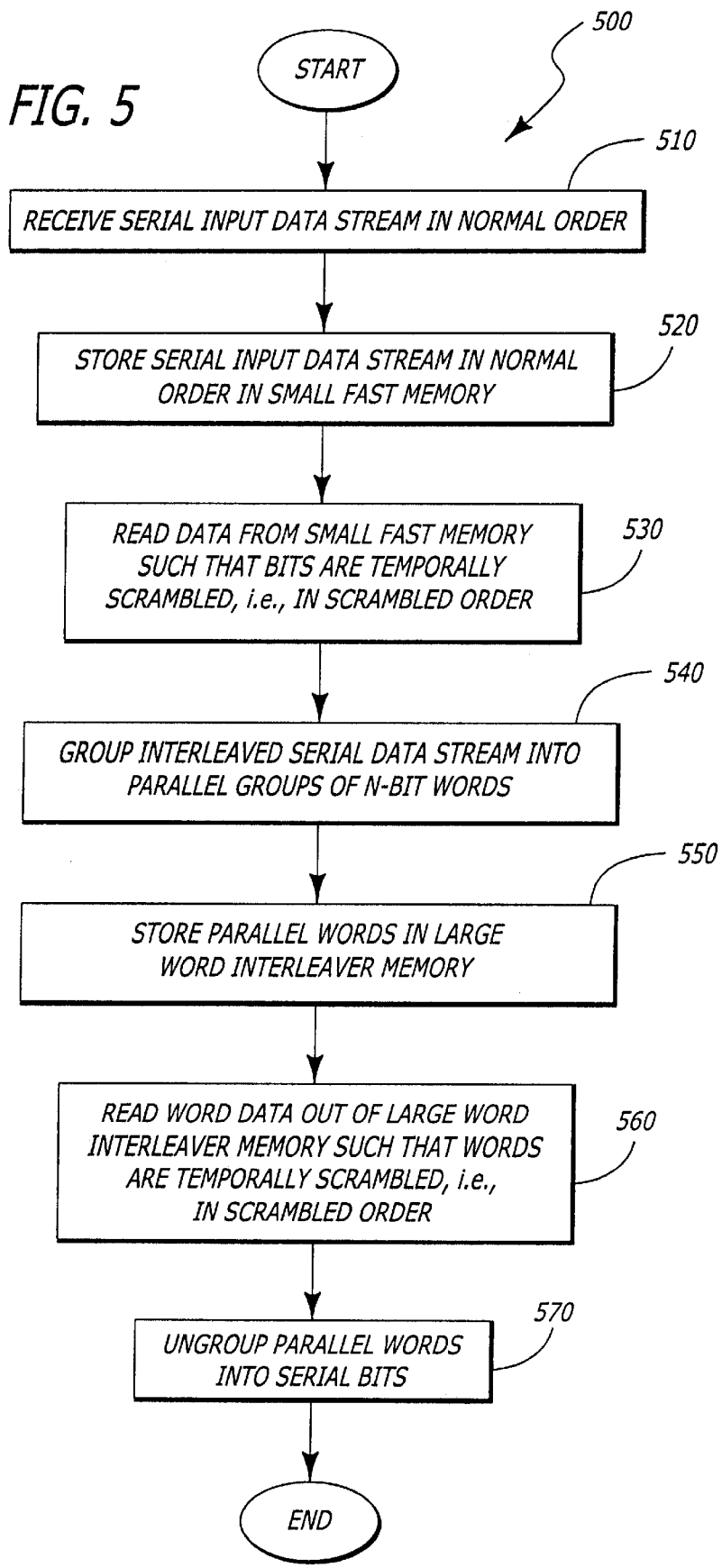

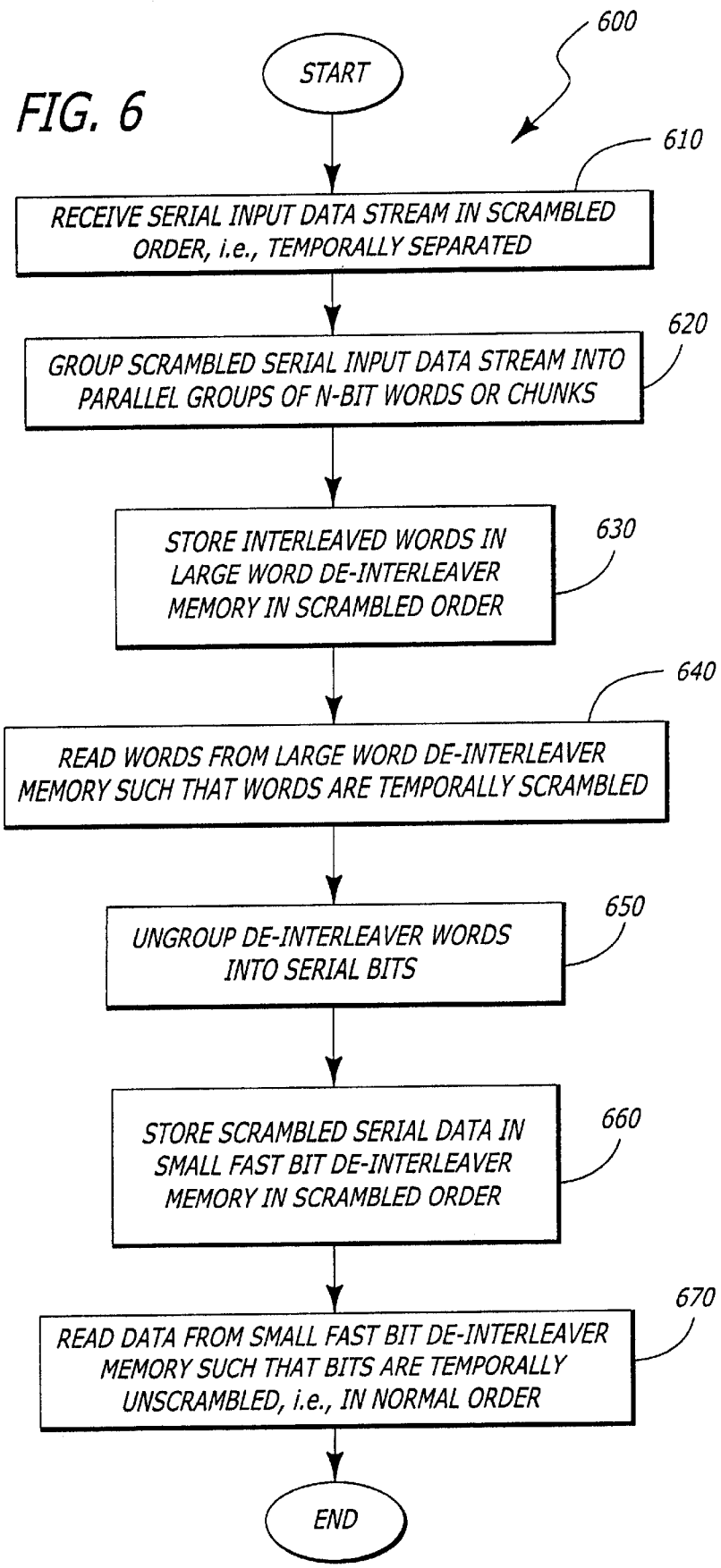

TEMPORALLY SEPARATING AND RE-ORGANIZING DATA USING TWO-STAGE INTERLEAVING AND DE-INTERLEAVING

BACKGROUND

1. Field of the Invention

This invention relates to data communication. In particular, the invention relates to data interleaving and de-interleaving.

2. Description of Related Art

Many applications in communication require the data to be temporally separated to improve error distribution statistics. In a typical communication system, errors tend to occur in bursts and the error pattern is highly correlated and concentrated in a small portion of the data stream. The common error correction methods work better when the error events are distributed randomly and appear uncorrelated. Temporally separating the input data stream redistributes the data bits so that the errors are spread into several different code words, resulting in a more random distribution of error events.

Data interleaving is a common technique to temporally separate digital information. The purpose is to provide a time buffer between errors which are known to be clustered in time. The time buffer provides an opportunity to correct successive erroneous bits using error correcting code (ECC) methods.

However, as the data rates increase, traditional techniques to temporally separate data or to re-organize temporally separated data become inefficient. To accommodate high data rates, traditional techniques typically require expensive hardware.

Therefore there is a need in the technology to provide an efficient method to temporally separate an input data stream and to re-organize a temporally separated input data stream in a communication system.

SUMMARY

The present invention is a method and apparatus for temporally separating an input data stream in a transmit circuit and for re-organizing a temporally separated input data stream in a receive circuit.

In the transmit circuit, a first interleaver interleaves the serial input data stream. A first converter is coupled to the first interleaver to convert the interleaved serial input data stream into groups of N-bit words where N is a positive integer. A second interleaver is coupled to the first converter to interleave the groups of N-bit words. A second converter is coupled to the second interleaver to convert the interleaved groups of N-bit words into a serial output data stream. The output data stream corresponds to the temporally separated input data stream.

In the receive circuit, a first converter converts the serial input data stream into groups of N-bit words where N is a positive integer. A first de-interleaver is coupled to the first converter to de-interleave the groups of N-bit words. A second converter is coupled to the first de-interleaver to convert the de-interleaved groups of N-bit words into interleaved serial data. A second de-interleaver is coupled to the second converter to de-interleave the interleaved serial data into an output data stream. The output data stream corresponds to the re-organized input data stream.

BRIEF DESCRIPTION OF THE DRAWINGS

The features and advantages of the present invention will become apparent from the following detailed description of the present invention in which:

FIG. 5 is a flowchart illustrating a process to temporally separate an input data stream according to one embodiment of the invention.

FIG. 6 is a flowchart illustrating a process to re-organize a temporally separated input data stream according to one embodiment of the invention.

DESCRIPTION

The present invention is a method and apparatus for temporally separating an input data stream in a transmit circuit and for re-organizing a temporally separated input data stream in a receive circuit.

In the transmit circuit, a first interleaver interleaves the serial input data stream. A first converter is coupled to the first interleaver to convert the interleaved serial input data stream into groups of N-bit words where N is a positive integer. A second interleaver is coupled to the first converter to interleave the groups of N-bit words. A second converter is coupled to the second interleaver to convert the interleaved groups of N-bit words into a serial output data stream. The output data stream corresponds to the temporally separated input data stream.

In the receive circuit, a first converter converts the serial input data stream into groups of N-bit words where N is a positive integer. A first de-interleaver is coupled to the first converter to de-interleave the groups of N-bit words. A second converter is coupled to the first de-interleaver to convert the de-interleaved groups of N-bit words into interleaved serial data. A second de-interleaver is coupled to the second converter to de-interleave the interleaved serial data into an output data stream. The output data stream corresponds to the re-organized input data stream.

Figure 1:
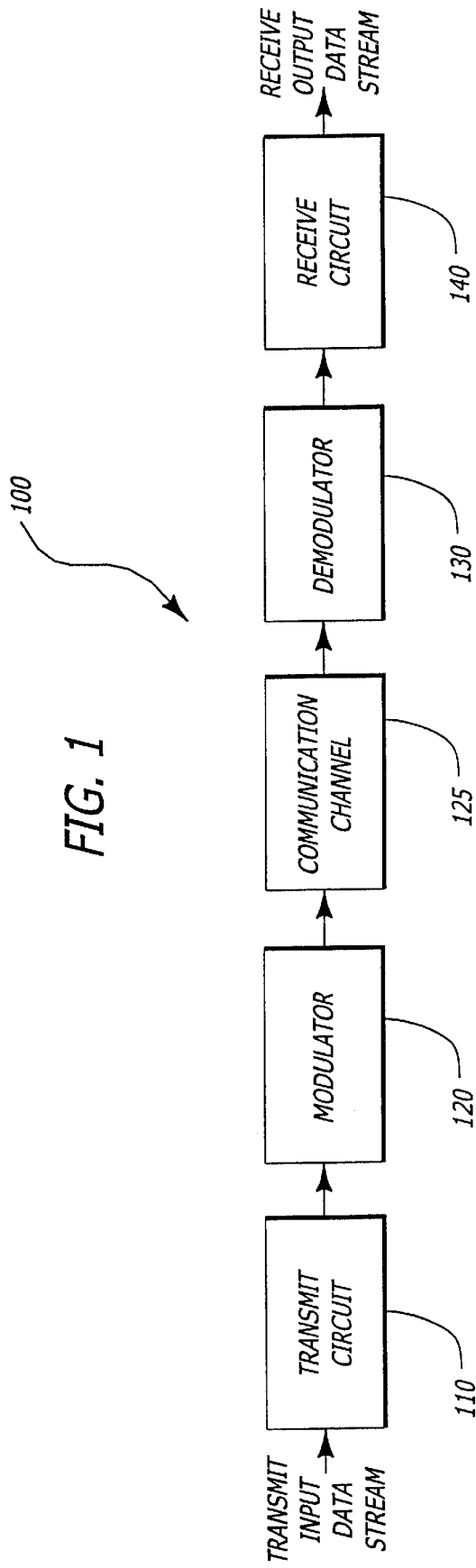
FIG. 1 is a diagram illustrating a system in which one embodiment of the invention can be practiced.

FIG. 1 is a diagram illustrating a system 100 in which one embodiment of the invention can be practiced. The system 100 includes a transmit circuit 110, a modulator 120, a communication channel 125, a demodulator 130, and a receive circuit 140.

The transmit circuit 110 receives a transmit input data stream and generates a transmit output data stream. The transmit input data stream is typically generated from an encoder which encodes the information into a serial stream of data bits or symbols. The transmit circuit 110 temporally separates the input data stream to separate adjacent data bits. The transmit circuit 110 achieves a high data rate with efficient hardware by using a two-stage interleaving process.

The modulator 120 receives the transmit output data stream and modulates the data stream to become a signal carrying the information. The signal is then transmitted through the communication channel 125. The communication channel 125 is any appropriate communication medium that can carry the modulated signal.

The demodulator 130 receives the transmitted signal through the communication channel 125. The received signal is then converted into a receive input data stream. The receive input data stream is temporally separated. The receive circuit 140 receives the receive input data stream and re-organizes the temporally separated input data stream to generate a receive output data stream. The receive circuit 140 achieves a high data rate with simple hardware by using a two-stage de-interleaving process. The receive output data stream is then further processed by a decoder to decode the digital information and correct any errors that may have been introduced in the communication channel.

Figure 2A:
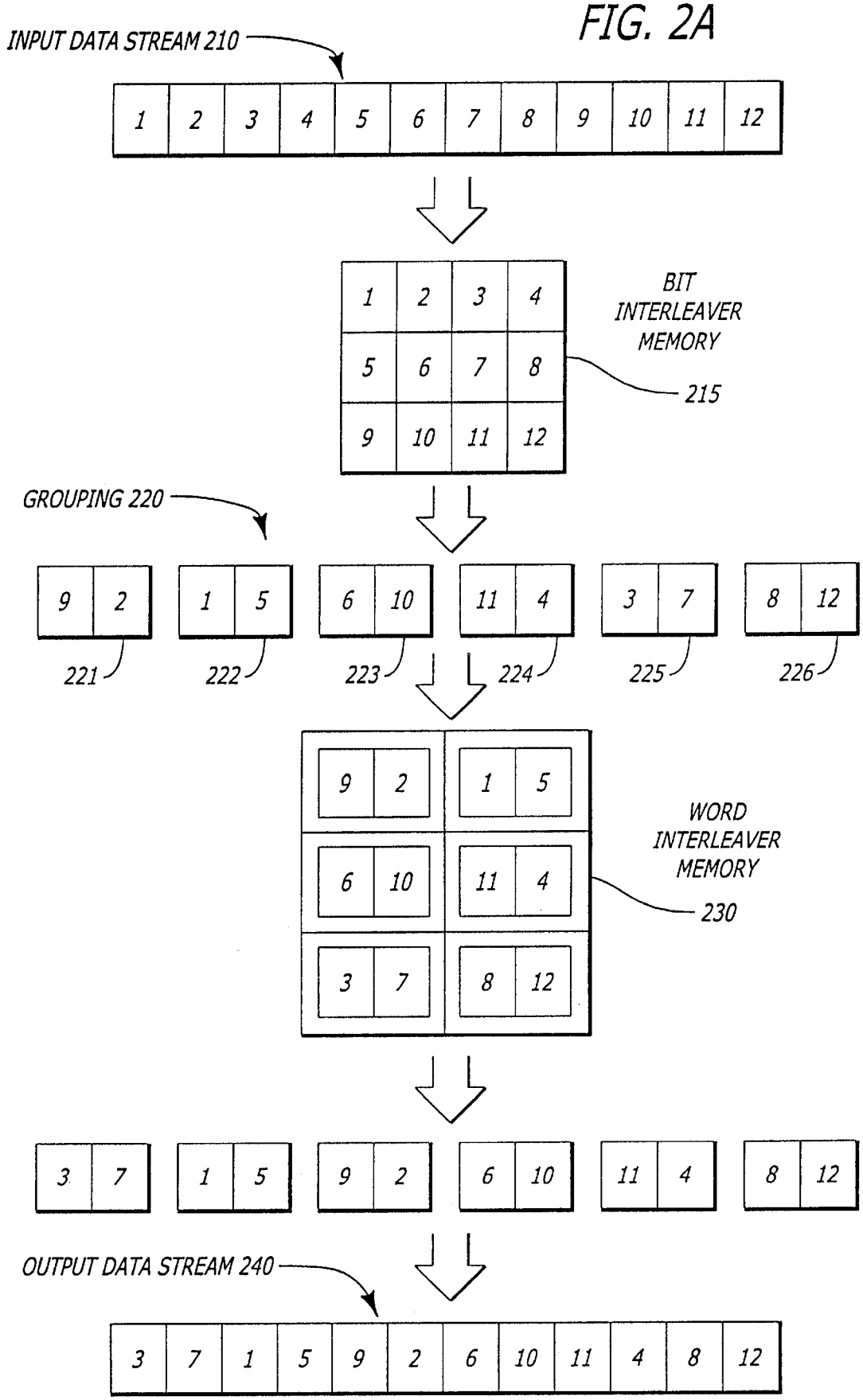
FIG. 2A is a diagram illustrating a sequence of operations to temporally separate an input data stream in the transmit circuit shown in FIG. 1 according to one embodiment of the invention.

FIG. 2A is a diagram illustrating a sequence of operations to temporally separate an input data stream in the transmit circuit shown in FIG. 1 according to one embodiment of the invention.

The two-stage interleaving process to temporally separate the input data stream includes a bit interleaving stage followed by a word interleaving stage. High data rate and efficient hardware can be achieved by using a small and fast memory for the bit interleaver and a large and slow memory for the word interleaver. FIG. 2A provides an illustrative example for the two-stage interleaving. In this illustrative example, the input data stream 210 consists of 12 data bits numbered 1, 2, 3, . . . 12.

In the first stage of interleaving, the interleaving is performed on a bit basis. The input data stream is stored in a bit interleaver memory 215 in a bit normal order. Then the stored input data stream is read out in a bit scrambled order such that adjacent bits are separated. For example, the bit normal order is 1, 2, 3, 4, 5, 6, 7, 8, 9, 10, 11, and 12, while the bit scrambled order is 9, 2, 1, 5, 6, 10, 11, 4, 3, 7, 8, and 12.

The scrambled bits are then converted into groups of N-bit words in a word grouping 220. In the example of FIG. 2A, N=2. The scrambled data bits are grouped into six groups of 2-bit words. The six groups are groups 221 (9,2), 222 (1, 5), 223 (6, 10), 224 (11, 4), 225 (3, 7), and 226 (8, 12).

In the second stage of interleaving, the interleaving is performed on the word basis. The groups of N-bit words are then stored in a word interleaver memory 230 in a word normal order. Then, the stored words are read out in a word scrambled order such that adjacent words are separated. For example, the word normal order is (9, 2), (1, 5), (6, 10), (11, 4), (3, 7), and (8, 12), while the word scrambled order is (3, 7), (1, 5), (9, 2), (6, 10), (11, 4), and (8, 12).

The scrambled words are then converted into an output data stream 240. The output data stream 240 is a serial data stream and includes 3, 7, 1, 5, 9, 2, 6, 10, 11, 4, 8, and 12.

The word interleaver interleaves the words, while keeping the bits in each word together, thereby providing further separation of originally adjacent bits. This greater separation of adjacent bits allows greater error correction capability. Each stage of the two-stage interleaving process may be block or convolutional or any other type of interleaver.

Figure 2B:
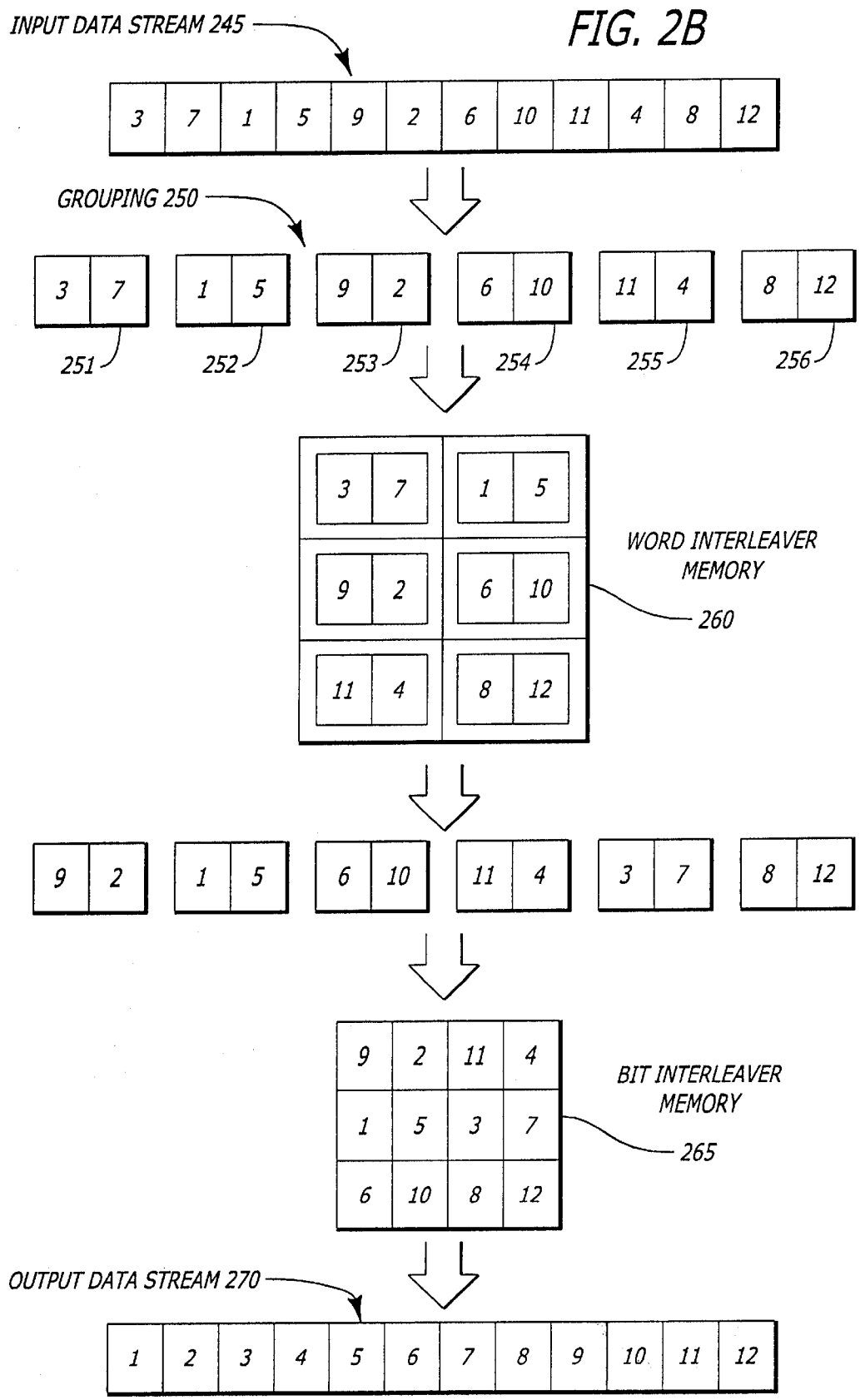
FIG. 2B is a diagram illustrating a sequence of operations to re-organize a temporally separated input data stream in the receive circuit shown in FIG. 1 according to one embodiment of the invention.

FIG. 2B is a diagram illustrating a sequence of operations to re-organize a temporally separated input data stream in the receive circuit shown in FIG. 1 according to one embodiment of the invention.

The two-stage de-interleaving process to re-organize a temporally separated input data stream includes a word de-interleaving stage followed by a bit de-interleaving stage. High data rate and efficient hardware can be achieved by using a small and fast memory for the bit interleaver and a large and slow memory for the word interleaver. FIG. 2B provides an illustrative example for the two-stage de-interleaving. In this illustrative example, the temporally separated input data stream 245 consists of 12 data bits numbered 3, 7, 1, 5, 9, 2, 6, 10, 11, 4, 8, and 12.

In the first stage of de-interleaving, the interleaving is performed on a word basis. First, the input data stream 245 is converted into groups of N-bit words in a word grouping 250. In the example of FIG. 2B, N=2. The scrambled data bits are grouped into six groups of 2-bit words. The six groups are groups 251 (3, 7), 252 (1, 5), 253 (9, 2), 254 (6, 10), 255 (11, 4), and 256 (8, 12).

The word de-interleaver de-interleaves the words, while keeping the bits in each word together. The groups of N-bit words are then stored in a word de-interleaver memory 260 in a word scrambled order. Then, the stored words are read out in a word normal order such that adjacent words from the original transmitted stream are again adjacent. For example, the word scrambled order is (3, 7), (1, 5), (9, 2), (6, 10), (11, 4), and (8, 12), while the word normal order is (9, 2), (1, 5), (6, 10), (11, 4), (3, 7), and (8, 12). Then the unscrambled groups of N-bit words are converted into a serial bit interleaved data stream.

In the second stage of de-interleaving, the de-interleaving is performed on a bit basis. The bit interleaved data stream is stored in a bit de-interleaver memory 265 in a bit scrambled order. Then the stored input data stream is read out in a bit normal order such that adjacent bits are merged to become an output data stream 270. For example, the bit scrambled order is 9, 2, 1, 5, 6, 10, 11, 4, 3, 7, 8, and 12, while the bit normal order is 1, 2, 3, 4, 5, 6, 7, 8, 9, 10, 11, and 12.

Each stage of the two-stage de-interleaving process can be block or convolutional or other type of de-interleaver, to match the interleaver.

Figure 3A:
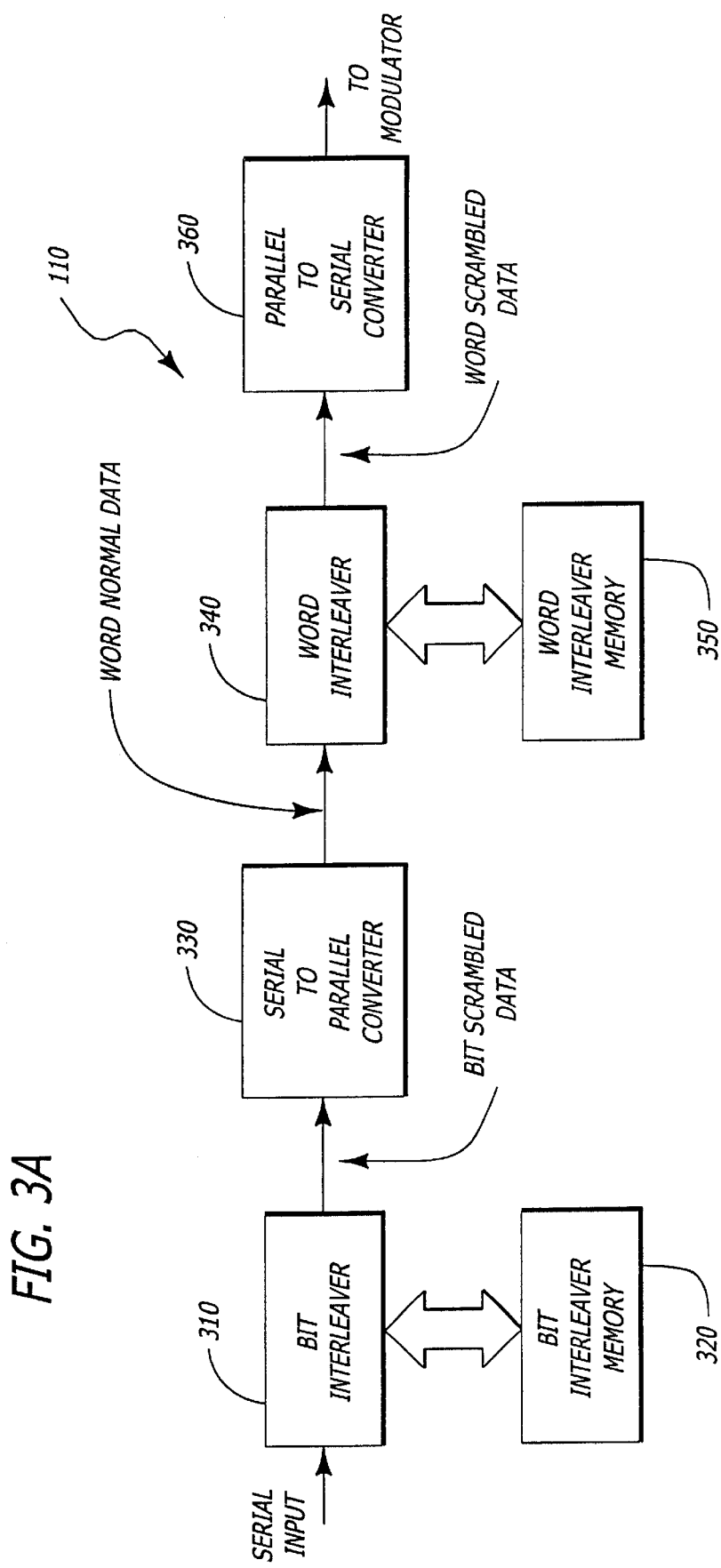
FIG. 3A is a diagram illustrating a transmit circuit shown in FIG. 1 according to one embodiment of the invention.

FIG. 3A is a diagram illustrating a transmit circuit 110 shown in FIG. 1 according to one embodiment of the invention. The transmit circuit 110 includes a bit interleaver 310, a bit interleaver memory 320, a serial-to-parallel converter 330, a word interleaver 340, a word interleaver memory 350, and a parallel-to-serial converter 360.

The bit interleaver 310 receives the input data stream and generates an interleaved bit stream. The interleaving is performed on a bit basis. The bit interleaver 310 stores the input data stream in the bit interleaver memory 320 in a bit normal order. The bit interleaver memory 320 is organized as K×1 where K is the number of bits to be interleaved. The data bus for the bit interleaver memory 320 is 1-bit. The bit interleaver 310 then reads the stored data in a scrambled order at a first clock rate to separate adjacent data bits. The serial-to-parallel converter 330 parallelizes the input data stream into a group of N-bit words where N is a positive integer. For best performance, the temporal separation provided by the bit interleaver should be the greater than the word size N.

The word interleaver 340 receives the groups of N-bit words and interleaves the groups of N-bit words. The interleaving is performed on a word basis. The bits within each word are kept together as scrambled by the bit interleaver 310. The word interleaver 340 stores the groups of N-bit words in the word interleaver memory 350 in a word normal order. The word interleaver memory 350 is organized as L×N where L is the number of the N-bit words to be interleaved. Note that the data bus for the word interleaver memory 350 is N bits. The word interleaver 340 then reads the stored groups of N-bit words in a scrambled order at a second clock rate. The second clock rate is slower than the first clock rate by a factor of N. The word interleaver memory 350 is typically larger and slower than the bit interleaver memory 320. The parallel-to-serial converter 360 serializes the N-bit words into the output data stream to the modulator 120 (FIG. 1). For ease of synchronizing the de-interleaver operation to the interleaver operation, the size of the word interleaver should be an integer multiple of the size of the bit interleaver.

The bit interleaver 310, the bit interleaver memory 320, the serial-to-parallel converter 330, the word interleaver 340, and the parallel-to-serial converter 360 can be efficiently implemented in a single integrated circuit device. This high level of integration allows the bit interleaver 310 to operate at high speed while maintaining low cost because the amount of high speed bit interleaver memory 320 can be kept to a minimum. The word interleaver memory 350 can reside off-chip. In one embodiment, the bit interleaver memory 320 is high speed static random access memory located on-chip and the word interleaver memory 350 is slow speed static random access memory located off-chip.

Figure 3B:
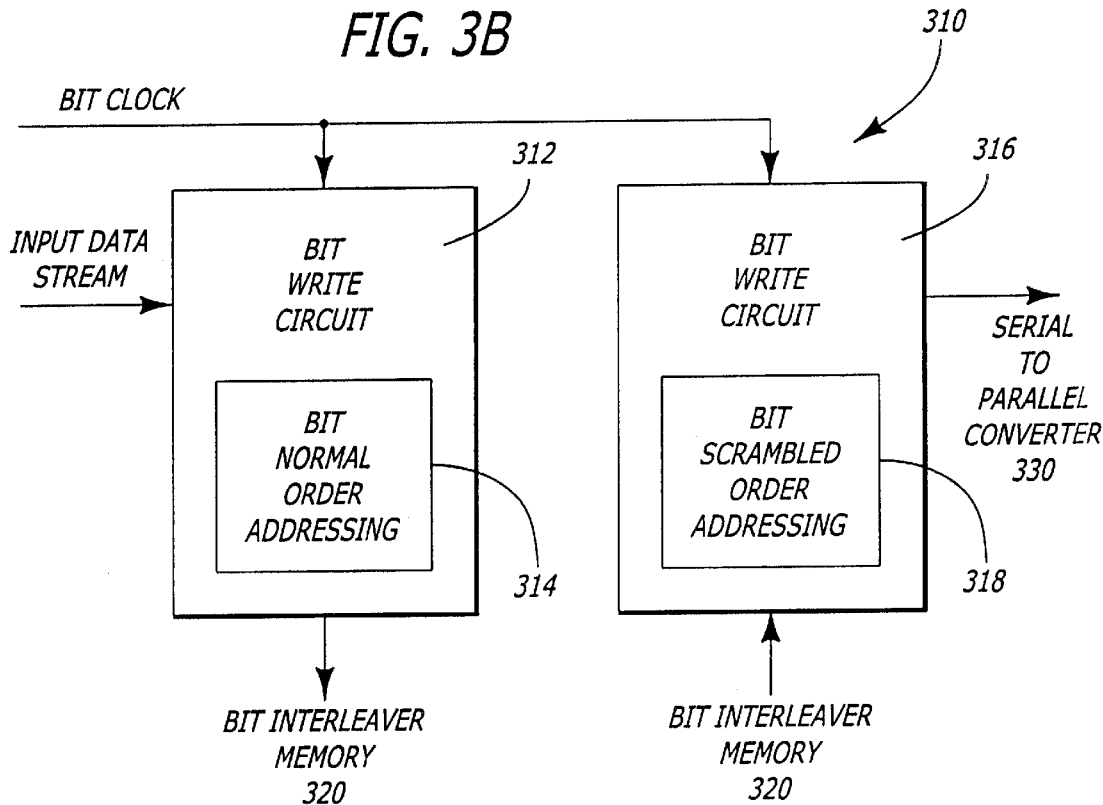
FIG. 3B is a diagram illustrating a bit interleaver shown in FIG. 3A according to one embodiment of the invention.

FIG. 3B is a diagram illustrating a bit interleaver 310 shown in FIG. 3A according to one embodiment of the invention. The bit interleaver 310 includes a bit write circuit 312 and a bit read circuit 316.

The bit write circuit 312 receives the input data stream at a bit clock rate. The bit write circuit 312 includes a bit normal order addressing mechanism 314 to write the data bit into the bit interleaver memory 320 in a bit normal order. The bit normal order addressing mechanism 314 generates the addresses for the bit interleaver memory 320 according to some predefined normal order. This predefined normal order may be generated using a counter which increments the address directly to the bit interleaver memory 320 or indirectly to look up an address pattern stored in a look-up table, or a circuit which calculates an address according to a defined algorithm.

The bit read circuit 316 reads the stored input data stream from the bit interleaver memory 320 at a bit clock rate. The bit read circuit 316 includes a bit scrambled order addressing mechanism 318 to read the stored input data stream from the bit interleaver memory 320 in a bit scrambled order. The bit scrambled order addressing mechanism 318 generates the addresses for the bit interleaver memory 320 according to some predefined scrambled order. This predefined scrambled order may be generated using a counter which increments the address directly to the bit interleaver memory 320 or indirectly to look up an address pattern stored in a look-up table, or a circuit which calculates an address according to a defined algorithm. The bit read circuit 316 generates a bit scrambled data stream to the serial-to-parallel converter 330 (FIG. 1).

Figure 3C:
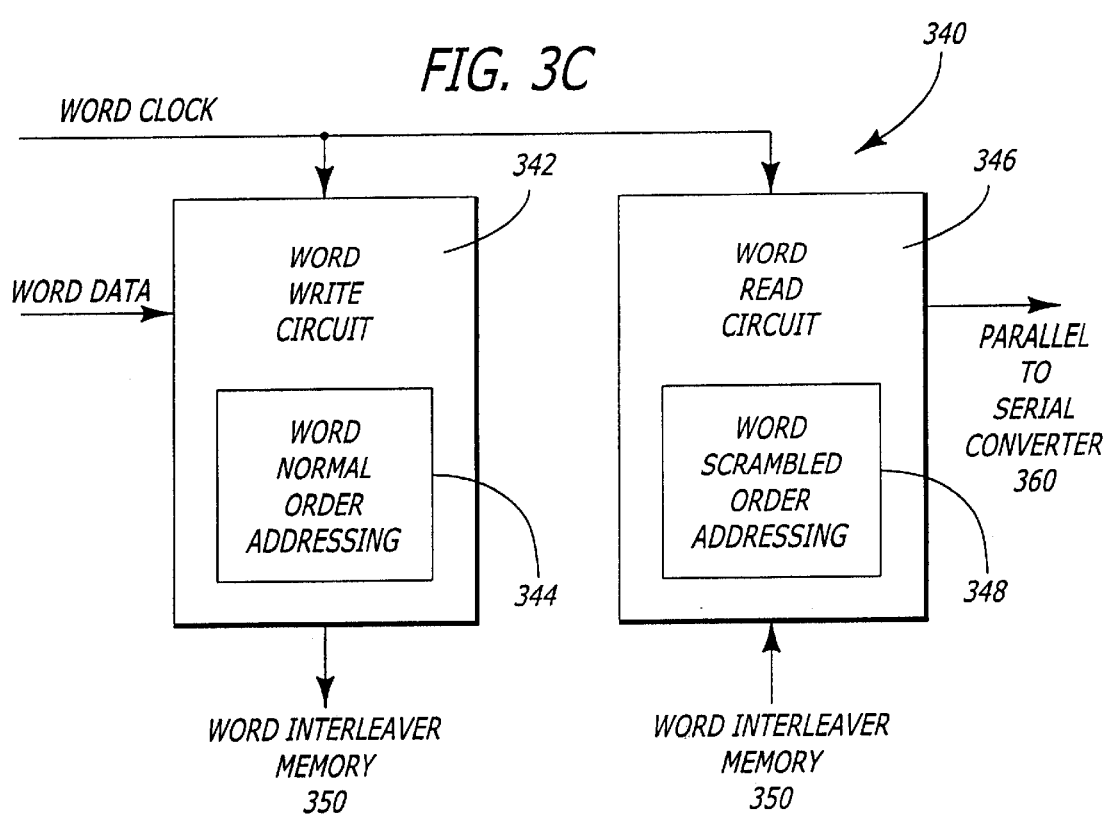
FIG. 3C is a diagram illustrating a word interleaver shown in FIG. 3A according to one embodiment of the invention.

FIG. 3C is a diagram illustrating a word interleaver 340 shown in FIG. 3A according to one embodiment of the invention. The word interleaver 340 includes a word write circuit 342 and a word read circuit 346.

The word write circuit 342 receives the groups of N-bit words at a word clock rate. The word write circuit 342 includes a word normal order addressing mechanism 344 to write the data words into the word interleaver memory 350 in a word normal order. The word normal order addressing mechanism 344 generates the addresses for the word interleaver memory 350 according to some predefined normal order. This predefined normal order may be generated using a counter which increments the address directly to the word interleaver memory 350 or indirectly to look up an address pattern stored in a look-up table, or a circuit which calculates an address according to a defined algorithm.

The word read circuit 346 reads the stored groups of N-bit words from the word interleaver memory 350 at a word clock rate. The word read circuit 346 includes a word scrambled order addressing mechanism 348 to read the stored groups of N-bit words from the word interleaver memory 350 in a word scrambled order. The word scrambled order addressing mechanism 348 generates the addresses for the word interleaver memory 350 according to some predefined scrambled order. This predefined scrambled order may be generated using a counter which increments the address directly to the word interleaver memory 350 or indirectly to look up an address pattern stored in a look-up table, or a circuit which calculated an address according to a defined algorithm. The word read circuit 346 generates a word scrambled data stream to the parallel-to-serial converter 360 (FIG. 1).

Figure 4A:
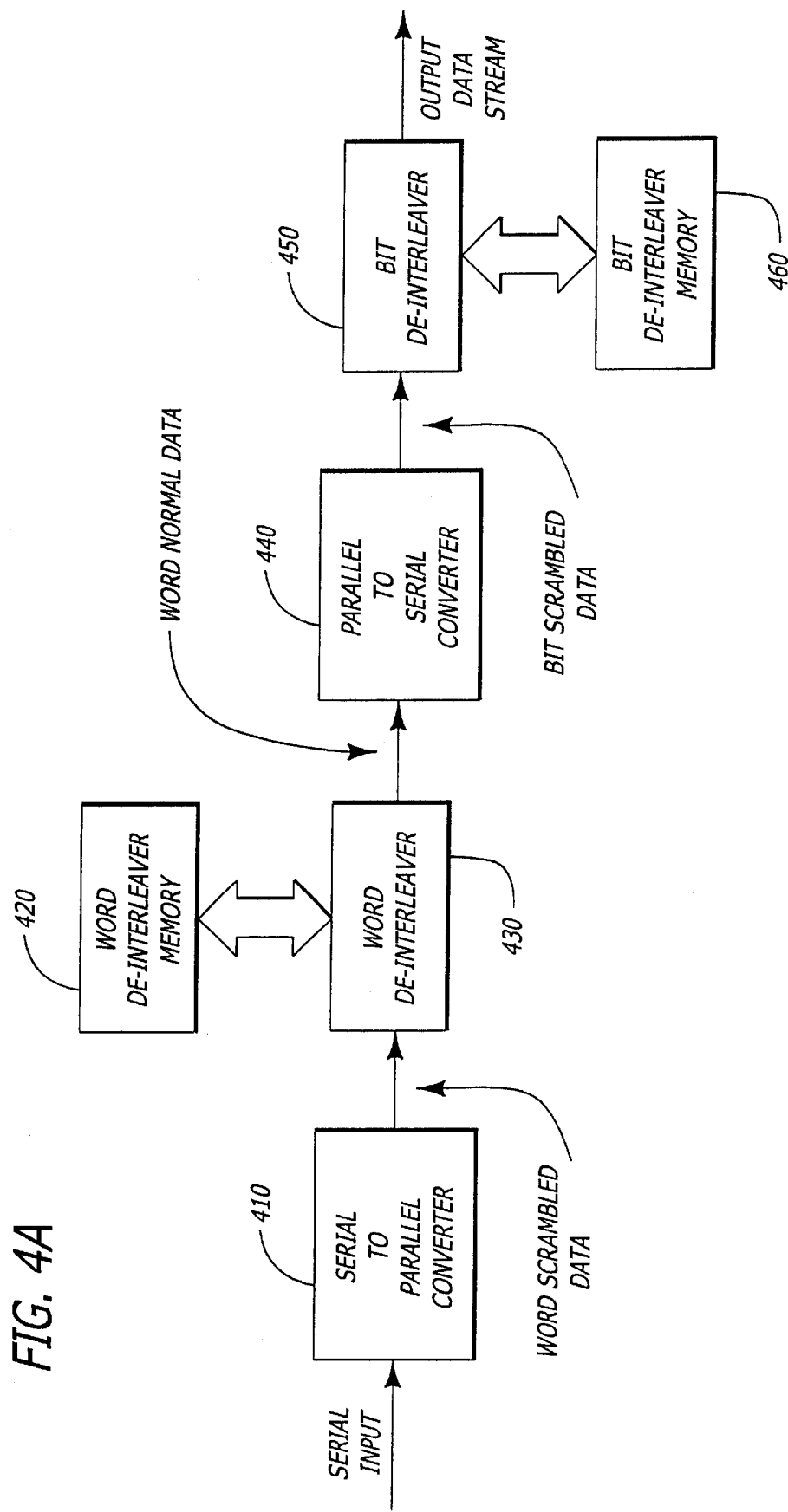
FIG. 4A is a diagram illustrating a receive circuit shown in FIG. 1 according to one embodiment of the invention.

FIG. 4A is a diagram illustrating a receive circuit 140 shown in FIG. 1 according to one embodiment of the invention. The receive circuit 140 includes a serial-to-parallel converter 410, a word de-interleaver 430, a word de-interleaver memory 420, a parallel-to-serial converter 440, a bit de-interleaver 450, and a bit de-interleaver memory 460.

The serial-to-parallel converter 410 converts the input data stream into groups of N-bit words where N is a positive integer by parallelizing the input data stream into the N-bit words. The word de-interleaver 430 receives the groups of N-bit words from the serial-to-parallel converter 410 and de-interleaves the groups of N-bit words using the word de-interleaver memory 420.

The parallel-to-serial converter 440 converts the de-interleaved groups of N-bit words into bit interleaved serial data. The bit de-interleaver 450 de-interleaves the bit interleaved serial data into an output data stream using the bit de-interleaver memory 460. The output data stream corresponds to the re-organized input data stream.

The serial-to-parallel converter 410, the word de-interleaver 430, the parallel-to-serial converter 440, the bit de-interleaver 450, and the bit de-interleaver memory 460 can be efficiently implemented in a single integrated circuit device. This high level of integration allows the bit de-interleaver 450 to operate at high speed while maintaining low cost because the amount of high speed bit de-interleaver memory 460 can be kept to a minimum. The word de-interleaver memory 420 can reside off-chip. In one embodiment, the bit de-interleaver memory 460 is high speed static random access memory located on-chip and the word de-interleaver memory 420 is slow speed static random access memory located off-chip.

Figure 4B:
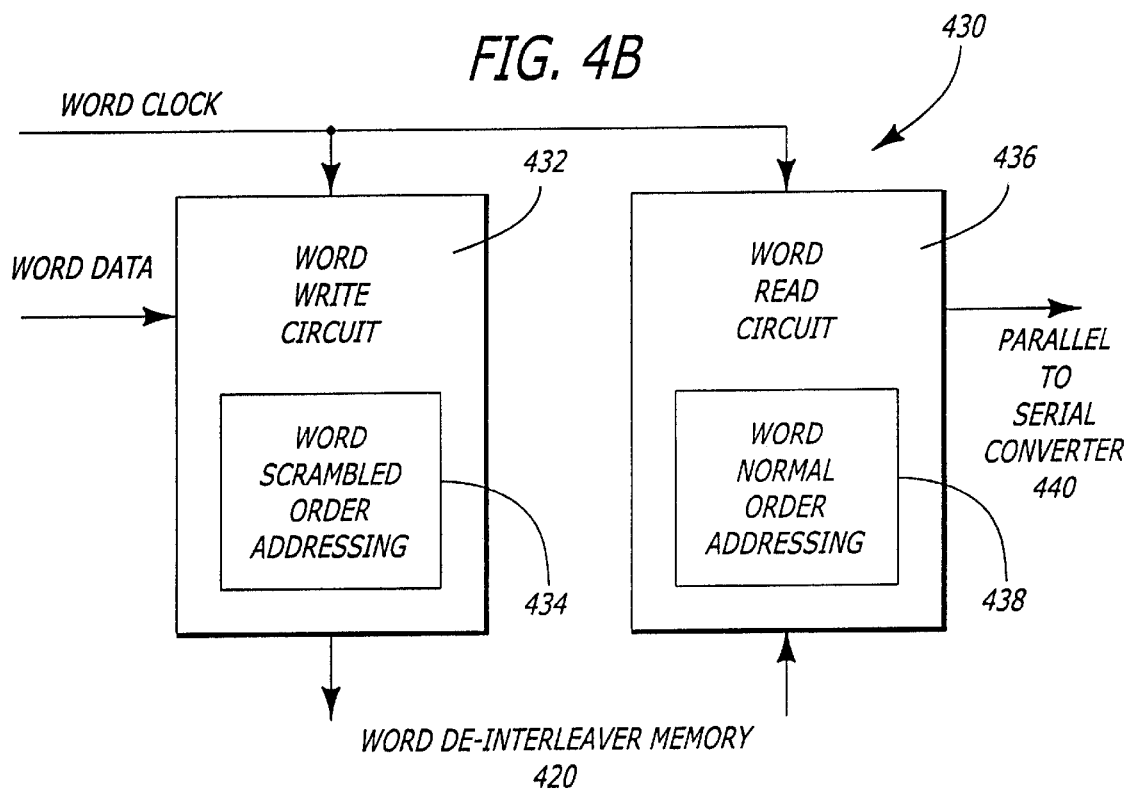
FIG. 4B is a diagram illustrating a word de-interleaver shown in FIG. 4A according to one embodiment of the invention.

FIG. 4B is a diagram illustrating a word de-interleaver 430 shown in FIG. 4A according to one embodiment of the invention. The word de-interleaver 430 includes a word write circuit 432 and a word read circuit 436.

The word write circuit 432 receives the groups of N-bit words at a word clock rate. The word write circuit 432 includes a word scrambled order addressing mechanism 434 to write the data words into the word de-interleaver memory 420 in a word scrambled order. The word scrambled order addressing mechanism 434 generates the addresses for the word de-interleaver memory 420 according to some predefined scrambled order. This predefined scrambled order may be generated using a counter which increments the address directly to the word de-interleaver memory 420 or indirectly to look up an address pattern stored in a look-up table, or a circuit which calculates an address according to a defined algorithm.

The word read circuit 436 reads the stored groups of N-bit words from the word de-interleaver memory 420 at a word clock rate. The word read circuit 436 includes a word normal order addressing mechanism 438 to read the stored groups of N-bit words from the word de-interleaver memory 420 in a word normal order. The word normal order essentially is used to reverse the word scrambled order in the transmit circuit 110 (FIG. 3A). The word normal order addressing mechanism 438 generates the addresses for the word de-interleaver memory 420 according to some predefined normal order. This predefined normal order may be generated using a counter which increments the address directly to the word de-interleaver memory 420 or indirectly to look up an address pattern stored in a look-up table, or a circuit which calculates an address according to a defined algorithm. The word read circuit 436 generates a word normal data stream to the parallel-to-serial converter 440 (FIG. 4A).

Figure 4C:
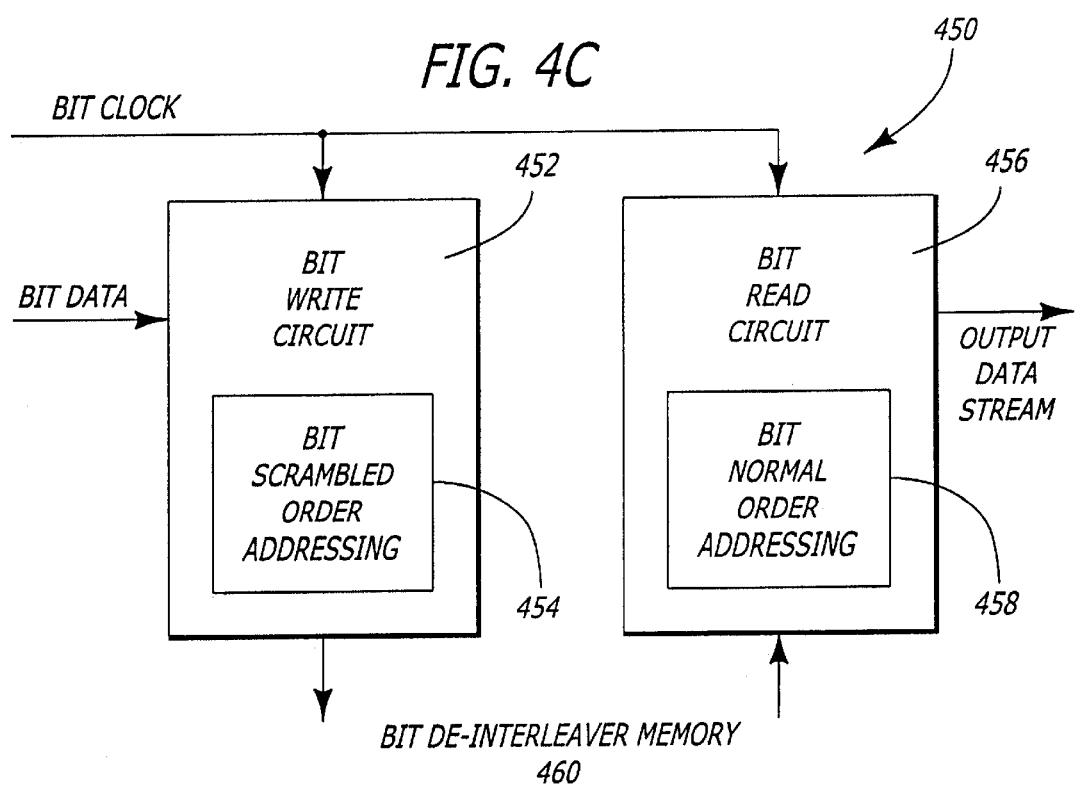
FIG. 4C is a diagram illustrating a bit de-interleaver shown in FIG. 4A according to one embodiment of the invention.

FIG. 4C is a diagram illustrating a bit de-interleaver 450 shown in FIG. 4A according to one embodiment of the invention. The bit de-interleaver 450 includes a bit write circuit 452 and a bit read circuit 456.

The bit write circuit 452 receives the serial input data stream at a bit clock rate. The bit write circuit 452 includes a bit scrambled order addressing mechanism 454 to write the data bit into the bit de-interleaver memory 460 in a bit scrambled order. The bit scrambled order addressing mechanism 454 generates the addresses for the bit de-interleaver memory 460 according to some predefined scrambled order. This predefined scrambled order may be generated using a counter which increments the address directly to the bit de-interleaver memory 460 or indirectly to look up an address pattern stored in a look-up table, or a circuit which calculates an address according to a defined algorithm.

The bit read circuit 456 reads the stored input data stream from the bit de-interleaver memory 460 at a bit clock rate. The bit read circuit 456 includes a bit normal order addressing mechanism 458 to read the stored input data stream from the bit de-interleaver memory 460 in a bit normal order. The bit normal order essentially is used to reverse the bit scrambled order in the transmit circuit 110 (FIG. 3A). The bit normal order addressing mechanism 458 generates the addresses for the bit de-interleaver memory 460 according to some predefined normal order. This predefined normal order may be generated using a counter which increments the address directly to the bit de-interleaver memory 460 or indirectly to look up an address pattern stored in a look-up table, or a circuit which calculates an address according to a defined algorithm. The bit read circuit 456 generates the output data stream.

FIG. 5 is a flowchart illustrating a process 500 to temporally separate an input data stream according to one embodiment of the invention.

Upon START, the process 500 receives the serial input data stream in a bit normal order (Block 510). This input data stream may be generated from an encoder that encodes the information using some coding scheme. Then the process 500 stores the input data stream in a small but fast memory (Block 520). Then, the process 500 reads the data bits from the small and fast memory such that the data bits are temporally scrambled, i.e., in a scrambled order (Block 530).

Next, the process 500 groups the interleaved data stream into parallel groups of N-bit words (Block 540). Then, the process 500 stored the words in a large word interleaver memory (Block 550). Then, the process 500 reads the stored word data out of the large word interleaver memory such that the words are further temporally separated, i.e., in scrambled order (Block 560).

Finally, the process 500 ungroups the parallel words into serial bits to become the output data stream (Block 570). The output data stream is then modulated by a modulator for transmitting. The process 500 is then terminated.

FIG. 6 is a flowchart illustrating a process 600 to re-organize a temporally separated input data stream according to one embodiment of the invention.

Upon START, the process 600 receives the serial input data stream in scrambled order, i.e., the serial input data stream is temporally separated (Block 610). The serial input data stream is generated by a de-modulator which receives the transmitted signal over a communication channel. Then, the process 600 groups the interleaved serial input data stream into groups of N-bit words (Block 620). Then, the process 600 stores the interleaved words in a large word de-interleaver memory (Block 630).

Next, the process 600 reads the data words from the large word de-interleaver memory such that the words are temporally unscrambled (Block 640). Then, the process 600 ungroups the de-interleaved words into serial data bits (Block 650). Then, the process 600 stores the interleaved serial data bits in a small bit de-interleaver memory (Block 660).

Finally, the process 600 reads the data from the small bit de-interleaved memory such that the bits are temporally unscrambled, i.e., in de-interleaved order (Block 670). The read data becomes the re-organized data stream. Then the process 600 is terminated.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. An apparatus to temporally separate an input data stream, the apparatus comprising:

a first interleaver to interleave the serial input data stream;

a first converter coupled to the first interleaver to convert the interleaved input data stream into groups of N-bit words, N being a positive integer;

a second interleaver coupled to the first converter to interleave the groups of N-bit words; and a second converter coupled to the second interleaver to convert the interleaved groups of N-bit words into a serial output data stream, the output data stream corresponding to the temporally separated input data stream.

2. The apparatus of claim 1 wherein the first interleaver comprises:

a first write circuit coupled to a first memory to store the input data stream in the first memory in a bit normal order; and a first read circuit coupled to the first memory to read the stored input data stream from the first memory in a bit scrambled order at a first clock rate, the bit scrambled order separating adjacent bits in the input data stream, the separated bits corresponding to the interleaved input data stream.

3. The apparatus of claim 2 wherein the first converter comprises a serial-to-parallel converter to parallelize the input data stream into the N-bit words.

4. The apparatus of claim 3 wherein the second interleaver comprises:

a second write circuit coupled to a second memory to store the groups of N-bit words in the second memory in a word normal order; and a second read circuit coupled to the second memory to read the stored groups of N-bit words in a word scrambled order at a second clock rate, the word scrambled order separating adjacent N-bit words, the separated N-bit words corresponding to the interleaved groups of N-bit words.

5. The apparatus of claim 4 wherein the second converter comprises a parallel-to-serial converter to serialize the N-bit words into the output data stream.

6. The apparatus of claim 5 wherein the first memory is substantially faster than the second memory.

7. The apparatus of claim 5 wherein the first memory is substantially smaller than the second memory.

8. The apparatus of claim 5 wherein the first clock rate is substantially faster than the second clock rate.

9. The apparatus of claim 8 wherein the first clock rate is faster than the second clock rate by a factor of N.

10. The apparatus of claim 5 wherein the first interleaver, the first converter, the second interleaver, the second converter, and the first memory are integrated in a single device.

11. An apparatus to re-organize a temporally separated input data stream, the apparatus comprising:

a first converter to convert the input data stream into groups of N-bit words, N being a positive integer;

a first de-interleaver coupled to the first converter to de-interleave the groups of N-bit words;

a second converter coupled to the first de-interleaver to convert the de-interleaved groups of N-bit words into interleaved serial data; and a second de-interleaver coupled to the second converter to de-interleave the interleaved serial data into an output data stream, the output data stream corresponding to the re-organized input data stream.

12. The apparatus of claim 11 wherein the first converter comprises a serial-to-parallel converter to parallelize the input data stream into the N-bit words.

13. The apparatus of claim 12 wherein the first de-interleaver comprises:

a first write circuit coupled to the first memory to store the groups of N-bit words in a first memory in a word scrambled order; and a first read circuit coupled to the first memory to read the stored groups of N-bit words from the first memory in a word normal order at a first clock rate, the word normal order re-arranging non-adjacent words in the groups of N-bit words, the re-arranged groups of N-bit words corresponding to the de-interleaved groups of N-bit words.

14. The apparatus of claim 13 wherein the second converter comprises a parallel-to-serial converter to serialize the N-bit words into the interleaved serial data.

15. The apparatus of claim 14 wherein the second de-interleaver comprises:

a second write circuit coupled to a second memory to store the bit interleaved serial data in the second memory in a bit scrambled order; and a second read circuit coupled to the second memory to read the stored bit interleaved serial data in a bit normal order at a second clock rate, the bit normal order re-arranging the bit interleaved serial data, the re-arranged serial data corresponding to the output data stream.

16. The apparatus of claim 15 wherein the first memory is substantially slower than the second memory.

17. The apparatus of claim 15 wherein the first memory is substantially larger than the second memory.

18. The apparatus of claim 15 wherein the first clock rate is substantially slower than the second clock rate.

19. The apparatus of claim 18 wherein the first clock rate is slower than the second clock rate by a factor of N.

20. The apparatus of claim 15 wherein the first interleaver, the first converter, the second interleaver, the second converter, and the second memory are integrated in a single device.

21. A method to temporally separate an input data stream, the method comprising:

interleaving the input data stream by a first interleaver;

converting the interleaved input data stream into groups of N-bit words by a first converter, N being a positive integer;

interleaving the groups of N-bit words by a second interleaver; and converting the interleaved groups of N-bit words into an output data stream by a second converter, the output data stream corresponding to the temporally separated input data stream.

22. The method of claim 21 wherein interleaving the input data stream comprises:

storing the input data stream in the first memory in a bit normal order by a first write circuit; and reading the stored input data stream from the first memory in a bit scrambled order at a first clock rate by a first read circuit, the bit scrambled order separating adjacent bits in the input data stream, the separated bits corresponding to the interleaved input data stream.

23. The method of claim 22 wherein converting the interleaved input data stream comprises parallelizing the input data stream into the N-bit words by a serial-to-parallel converter.

24. The method of claim 23 wherein interleaving the groups of N-bit words comprises:

storing the groups of N-bit words in the second memory in a word normal order by a second write circuit; and reading the stored groups of N-bit words in a word scrambled order at a second clock rate by a second read circuit, the word scrambled order separating adjacent N-bit words, the separated N-bit words corresponding to the interleaved groups of N-bit words.

25. The method of claim 24 wherein converting the interleaved groups of N-bit words comprises serializing the N-bit words into the output data stream by a parallel-to-serial converter.

26. The method of claim 25 wherein the first memory is substantially faster than the second memory.

27. The method of claim 25 wherein the first memory is substantially smaller than the second memory.

28. The method of claim 25 wherein the first clock rate is substantially faster than the second clock rate.

29. The method of claim 28 wherein the first clock rate is faster than the second clock rate by a factor of N.

30. The method of claim 25 wherein the first interleaver, the first converter, the second interleaver, the second converter, and the first memory are integrated in a single device.

31. A method to re-organize a temporally separated input data stream, the method comprising:
converting the input data stream into groups of N-bit words by a first converter, N being a positive integer;
de-interleaving the groups of N-bit words by a first de-interleaver;
converting the de-interleaved groups of N-bit words into bit interleaved serial data by a second converter; and
de-interleaving the bit interleaved serial data into an output data stream by a second de-interleaver, the output data stream corresponding to the re-organized input data stream.

32. The method of claim 31 wherein converting the input data stream comprises parallelizing the input data stream into the N-bit words by a serial-to-parallel converter.

33. The method of claim 32 wherein de-interleaving the groups of N-bit words comprises:
storing the groups of N-bit words in a first memory in a word scrambled order by a first write circuit; and
reading the stored groups of N-bit words from the first memory in a word normal order at a first clock rate by a first read circuit, the word normal order re-arranging non-adjacent words in the groups of N-bit words, the re-arranged groups of N-bit words corresponding to the de-interleaved groups of N-bit words.

34. The method of claim 33 wherein converting the de-interleaved groups of N-bit words comprises serializing the N-bit words into the bit interleaved serial data by a parallel-to-serial converter.

35. The method of claim 34 wherein de-interleaving the bit interleaved serial data comprises:
storing the bit interleaved serial data in the second memory in a bit scrambled order by a second write circuit; and
reading the stored bit interleaved serial data in a bit normal order at a second clock rate by a second read circuit, the bit normal order re-arranging the bit interleaved serial data, the re-arranged serial data corresponding to the output data stream.

36. The method of claim 35 wherein the first memory is substantially slower than the second memory.

37. The method of claim 35 wherein the first memory is substantially larger than the second memory.

38. The method of claim 35 wherein the first clock rate is substantially slower than the second clock rate.

39. The method of claim 38 wherein the first clock rate is slower than the second clock rate by a factor of N.

40. The method of claim 35 wherein the first interleaver, the first converter, the second interleaver, the second converter, and the second memory are integrated in a single device.

41. A system comprising:
a modulator to modulate an output data stream for transmission over a network channel; and
a transmit circuit coupled to the modulator to temporally separate an input data stream to generate the output data stream, the transmit circuit comprising:
a first interleaver to interleave the input data stream,
a first converter coupled to the first interleaver to convert the interleaved input data stream into groups of N-bit words, N being a positive integer,
a second interleaver coupled to the first converter to interleave the groups of N-bit words, and
a second converter coupled to the second interleaver to convert the interleaved groups of N-bit words into the output data stream, the output data stream corresponding to the temporally separated input data stream.

42. The system of claim 41 wherein the first interleaver comprises:
a first write circuit coupled to a first memory to store the input data stream in the first memory in a bit normal order; and
a first read circuit coupled to the first memory to read the stored input data stream from the first memory in a bit scrambled order at a first clock rate, the bit scrambled order separating adjacent bits in the input data stream, the separated bits corresponding to the interleaved input data stream.

43. The system of claim 42 wherein the first converter comprises a serial-to-parallel converter to parallelize the input data stream into the N-bit words.

44. The system of claim 43 wherein the second interleaver comprises:
a second write circuit coupled to a second memory to store the groups of N-bit words in the second memory in a word normal order; and
a second read circuit coupled to the second memory to read the stored groups of N-bit words in a word scrambled order at a second clock rate, the word scrambled order separating adjacent N-bit words, the separated N-bit words corresponding to the interleaved groups of N-bit words.

45. The system of claim 44 wherein the second converter comprises a parallel-to-serial converter to serialize the N-bit words into the output data stream.

46. The system of claim 45 wherein the first memory is substantially faster than the second memory.

47. The system of claim 45 wherein the first memory is substantially smaller than the second memory.

48. The system of claim 45 wherein the first clock rate is substantially faster than the second clock rate.

49. The system of claim 45 wherein the first interleaver, the first converter, the second interleaver, the second converter, and the first memory are integrated in a single device.

50. The system of claim 49 wherein the second memory is separated from the single device.

51. A system comprising:
a demodulator to demodulate a temporally separated input data stream; and
a receive circuit coupled to the demodulator to re-organize the temporally separated input data stream, the receive circuit comprising:
a first converter to convert the input data stream into groups of N-bit words, N being a positive integer,
a first de-interleaver coupled to the first converter to de-interleave the groups of N-bit words,
a second converter coupled to the first de-interleaver to convert the de-interleaved groups of N-bit words into interleaved serial data, and
a second de-interleaver coupled to the second converter to de-interleave the interleaved serial data into an output data stream, the output data stream corresponding to the re-organized input data stream.

52. The system of claim 51 wherein the first converter comprises a serial-to-parallel converter to parallelize the input data stream into the N-bit words.

53. The system of claim 52 wherein the first de-interleaver comprises:
- a first write circuit coupled to the first memory to store the groups of N-bit words in a first memory in a word scrambled order; and
- a first read circuit coupled to the first memory to read the stored groups of N-bit words from the first memory in a word normal order at a first clock rate, the word normal order re-arranging non-adjacent words in the groups of N-bit words, the re-arranged groups of N-bit words corresponding to the de-interleaved groups of N-bit words.

54. The system of claim 53 wherein the second converter comprises a parallel-to-serial converter to serialize the N-bit words into the interleaved serial data.

55. The system of claim 54 wherein the second de-interleaver comprises:
- a second write circuit coupled to a second memory to store the interleaved serial data in the second memory in a bit scrambled order; and
- a second read circuit coupled to the second memory to read the stored interleaved serial data in a bit normal order at a second clock rate, the normal order re-arranging the interleaved serial data, the re-arranged serial data corresponding to the output data stream.

56. The system of claim 55 wherein the first memory is substantially slower than the second memory.

57. The system of claim 55 wherein the first memory is substantially larger than the second memory.

58. The system of claim 55 wherein the first clock rate is substantially slower than the second clock rate.

59. The system of claim 55 wherein the first interleaver, the first converter, the second interleaver, the second converter, and the second memory are integrated in a single device.

60. The system of claim 59 wherein the first memory is separated from the single device.

* * * * *